(12) United States Patent
Khlat

(10) Patent No.: US 11,108,610 B2
(45) Date of Patent: Aug. 31, 2021

(54) MULTI-LEVEL VOLTAGE CIRCUIT AND RELATED APPARATUS

(71) Applicant: Qorvo US, Inc., Greensboro, NC (US)

(72) Inventor: Nadim Khlat, Cugnaux (FR)

(73) Assignee: Qorvo US, Inc., Greensboro, NC (US)

( * ) Notice: Subject to any disclaimer, the term of this patent is extended or adjusted under 35 U.S.C. 154(b) by 0 days.

(21) Appl. No.: 16/446,779

(22) Filed: Jun. 20, 2019

(65) Prior Publication Data

US 2020/0204422 A1 Jun. 25, 2020

Related U.S. Application Data

(60) Provisional application No. 62/782,895, filed on Dec. 20, 2018.

(51) Int. Cl.
| | | |
|---|---|---|
| *H04L 27/26* | (2006.01) | |
| *H04L 27/34* | (2006.01) | |
| *H04L 27/36* | (2006.01) | |
| *H03G 1/00* | (2006.01) | |
| *H03F 3/193* | (2006.01) | |
| *H03F 1/02* | (2006.01) | |

(52) U.S. Cl.
CPC ....... *H04L 27/2646* (2013.01); *H03G 1/0005* (2013.01); *H04L 27/3405* (2013.01); *H04L 27/361* (2013.01)

(58) Field of Classification Search
CPC ............... H04L 27/2646; H04L 27/361; H04L 27/3405; H03G 1/0005; H03F 1/32; H03F 2200/451; H03F 3/245; H03F 3/19; H03F 1/0222; G05F 1/561
USPC ......................... 330/297, 127, 129, 279, 134
See application file for complete search history.

(56) References Cited

U.S. PATENT DOCUMENTS 10,361,659 B2 * 7/2019 Henzler ................ H03F 1/0227

* cited by examiner

*Primary Examiner* — Hieu P Nguyen
(74) *Attorney, Agent, or Firm* — Withrow & Terranova, PLLC

(57) ABSTRACT

A multi-level voltage circuit and related apparatus are provided. The multi-level voltage circuit is configured to provide an average power tracking (APT) voltage to an amplifier circuit for amplifying a radio frequency (RF) signal, which can be modulated in a number of orthogonal frequency division multiplexing (OFDM) symbols. The RF signal may experience power fluctuations from one OFDM symbol to another and the multi-level voltage circuit may need to adjust the APT voltage accordingly. In examples discussed herein, when the APT voltage needs to increase from a present value to a higher future value at a predetermined effective time, the multi-level voltage circuit may start increasing the APT voltage from the present value toward the future value ahead of the predetermined effective time. As such, it may be possible to ramp up the APT voltage in a timely fashion to help improve linearity and efficiency of the amplifier circuit.

20 Claims, 6 Drawing Sheets

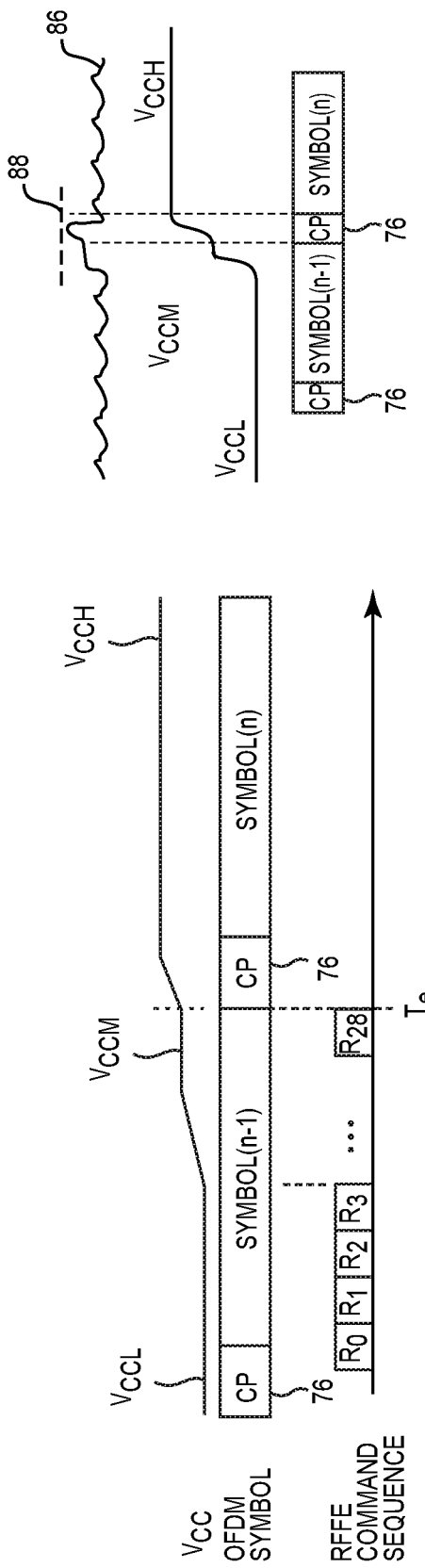
FIG. 4A
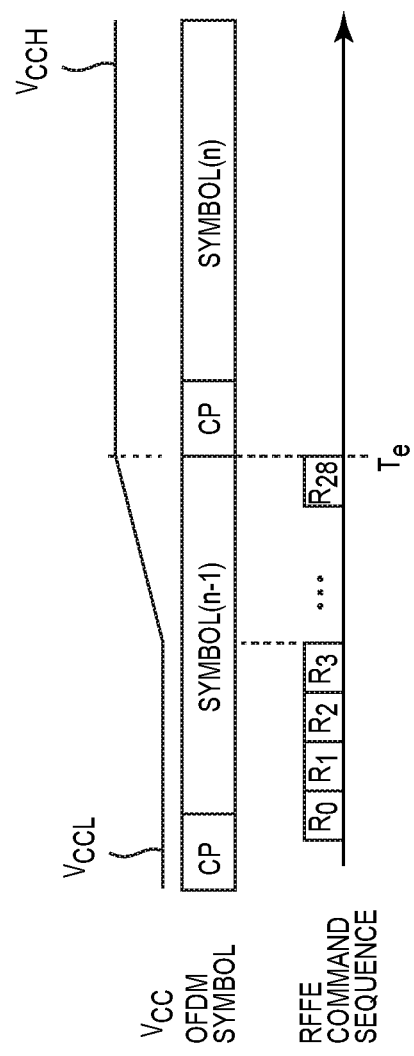
FIG. 4B
FIG. 4C

MULTI-LEVEL VOLTAGE CIRCUIT AND RELATED APPARATUS

RELATED APPLICATIONS

This application claims the benefit of U.S. provisional patent application Ser. No. 62/782,895, filed on Dec. 20, 2018, the disclosure of which is hereby incorporated herein by reference in its entirety.

FIELD OF THE DISCLOSURE

The technology of the disclosure relates generally to an average power tracking (APT) power amplifier apparatus.

BACKGROUND

Fifth-generation (5G) new radio (NR) (5G-NR) wireless communication systems have been widely regarded as the next wireless communication standard beyond the current third-generation (3G) communication standard, such as wideband code division multiple access (WCDMA), and fourth-generation (4G) communication standard, such as long-term evolution (LTE). The 5G-NR wireless communication system is expected to provide a significantly higher data rate, improved coverage range, enhanced signaling efficiency, and reduced latency compared to wireless communication systems based on the 3G and 4G communication standards. Moreover, the 5G-NR communication system is an orthogonal frequency division multiplexing (OFDM) based wireless system designed to operate across a wide range of radio frequency (RF) bands, which include a low-band (below 1 GHz), a mid-band (1 GHz to 6 GHz), and a high-band (above 24 GHz).

FIG. 1 is a schematic diagram of an exemplary OFDM time-frequency grid 10 illustrating at least one reserve block (RB 12). The OFDM time-frequency grid 10 includes a frequency axis 14 representing a frequency domain and a time axis 16 representing a time domain. Along the frequency axis 14, there are a number of subcarriers 18(1)-18(M). The subcarriers 18(1)-18(M) are orthogonally separated from each other by a subcarrier spacing (SCS) of 15 KHz, for example. Along the time axis 16, there are a number of OFDM symbols 20(1)-20(N). Each of the OFDM symbols 20(1)-20(N) is separated by a cyclic prefix (CP) (not shown) configured to act as a guard band to help overcome inter-symbol interference (ISI) between the OFDM symbols 20(1)-20(N). In the OFDM time-frequency grid 10, each intersection of the subcarriers 18(1)-18M) and the OFDM symbols 20(1)-20(N) defines a resource element (RE) 22.

In a 5G-NR system, an RF signal 24 can be modulated into multiple subcarriers among the subcarriers 18(1)-18(N) in the frequency domain (along the frequency axis 14) and multiple OFDM symbols among the OFDM symbols 20(1)-20(N) in the time domain (along the time axis 16). The table (Table 1) below summarizes OFDM configurations supported by the 5G-NR system.

TABLE 1

| SCS (KHz) | Slot Length (μs) | # of Slots per Subframe | CP (μs) | Symbol Duration (incl. CP) (μs) | Transient Period FR1: OFF-ON, ON-ON, ON-OFF (μs) | Transient Period FR2: OFF-ON, ON-ON, ON-OFF (μs) |
|---|---|---|---|---|---|---|
| 15 | 1000 | 1 | 4.69 | 71.43 | 10 | |
| 30 | 500 | 2 | 2.34 | 35.71 | 10 | 5 |
| 60 | 250 | 4 | 1.17 | 17.86 | 10 | 5 |
| 120 | 125 | 8 | 0.59 | 8.93 | | 5 |

According to Table 1, for an active-to-active mode transition with 15 KHz SCS, a transition settling time needs to be less than or equal to the respective CP of 4.69 μs. Likewise, for the active-to-active mode transition with 30 KHz SCS, a transition settling time needs to be less than or equal to the respective CP of 2.34 μs.

SUMMARY

Embodiments of the disclosure relate to a multi-level voltage circuit and related apparatus. The multi-level voltage circuit is configured to provide an average power tracking (APT) voltage to an amplifier circuit for amplifying a radio frequency (RF) signal, which can be modulated in a number of orthogonal frequency division multiplexing (OFDM) symbols. The RF signal may experience power fluctuations from one OFDM symbol to another. Accordingly, the multi-level voltage circuit may need to adjust the APT voltage for each of the OFDM symbols. In examples discussed herein, when the multi-voltage circuit needs to increase the APT voltage from a present value to a higher future value at a predetermined effective time, the multi-level voltage circuit may be configured to start increasing the APT voltage from the present value toward the future value ahead of the predetermined effective time. As such, it may be possible to ramp up the APT voltage in a timely fashion to help improve linearity and efficiency of the amplifier circuit.

In one aspect, a multi-level voltage circuit is provided. The multi-level voltage circuit includes a voltage circuit coupled to an amplifier circuit and configured to provide an APT voltage to the amplifier circuit for amplifying an RF signal. The multi-level voltage circuit also includes a control circuit. The control circuit is coupled to the voltage circuit and configured to receive a command sequence. The command sequence includes a voltage indicator configured to indicate a future value of the APT voltage higher than a present value of the APT voltage. The command sequence also includes a voltage change trigger succeeding the voltage indicator in the command sequence and configured to indicate a predetermined effective time of the future value. The control circuit is also configured to control the voltage circuit to increase the APT voltage from the present value toward the future value independent of the voltage change trigger.

In another aspect, an amplifier apparatus is provided. The amplifier apparatus includes an amplifier circuit configured to amplify an RF signal based on an APT voltage. The amplifier apparatus also includes a multi-level voltage circuit. The multi-level voltage circuit includes a voltage circuit configured to provide the APT voltage to the amplifier circuit. The multi-level voltage circuit also includes a control circuit. The control circuit is coupled to the voltage circuit and configured to receive a command sequence. The command sequence includes a voltage indicator configured to indicate a future value of the APT voltage higher than a present value of the APT voltage. The command sequence also includes a voltage change trigger succeeding the voltage indicator in the command sequence and configured to indicate a predetermined effective time of the future value. The control circuit is also configured to control the voltage circuit to increase the APT voltage from the present value toward the future value independent of the voltage change trigger.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

FIG. 4A is a schematic diagram providing an exemplary illustration of a triggering mechanism in the amplifier apparatus of FIG. 3 for causing the APT voltage to increase from the present value to the future value in between a pair of OFDM symbols;

FIG. 4B is a graphic diagram providing an exemplary illustration of improved EVM as a result of ability of the amplifier apparatus of FIG. 3 to ramp up the APT voltage $V_{CC}$ in a timely fashion;

Figure 3:
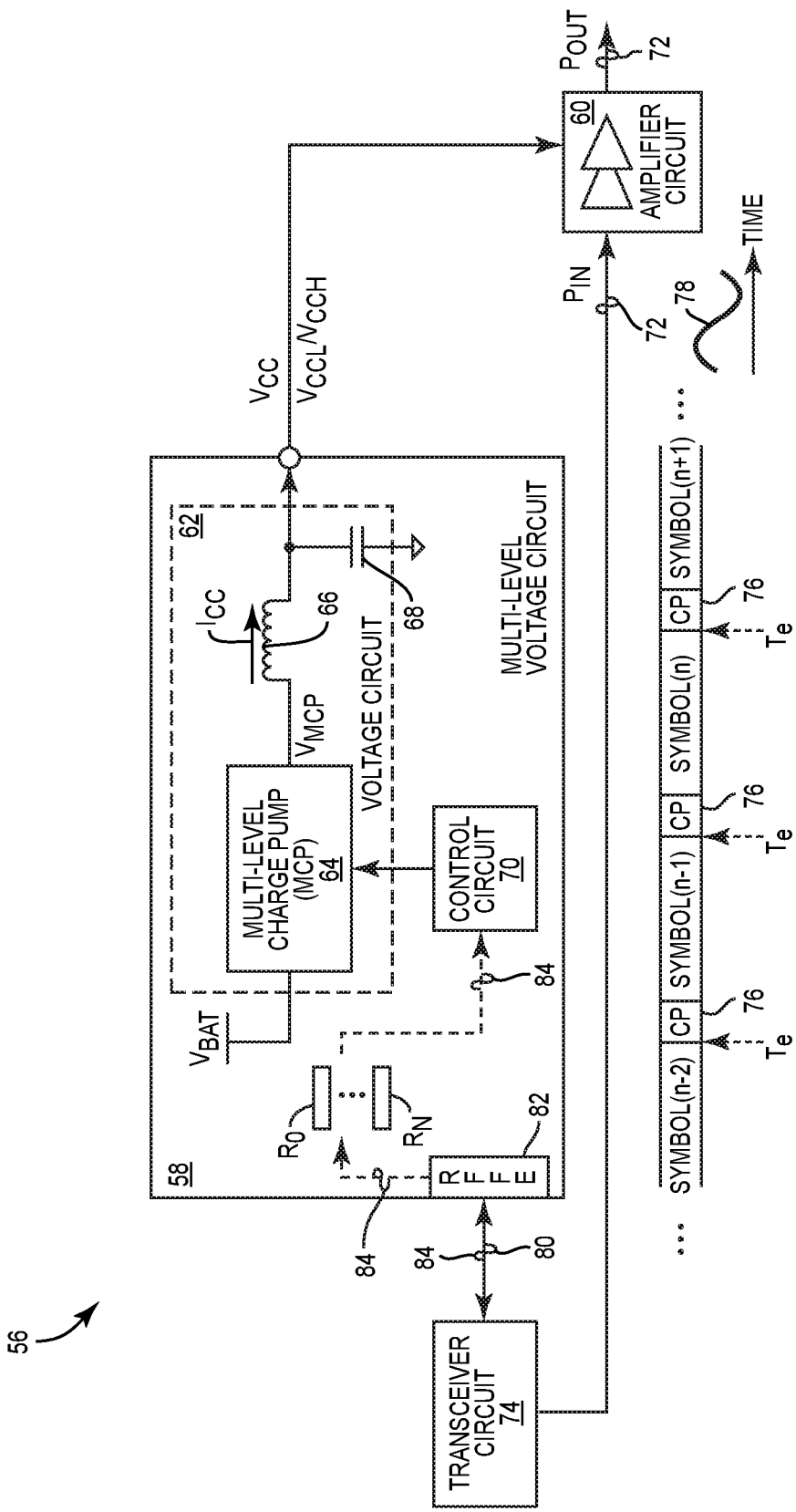
FIG. 3 is a schematic diagram of an amplifier apparatus in which a multi-level voltage circuit is configured according to an embodiment of the present disclosure to increase an APT voltage from a present value to a future value in a timely fashion to help improve EVM performance of an amplifier circuit.
Figure 5:
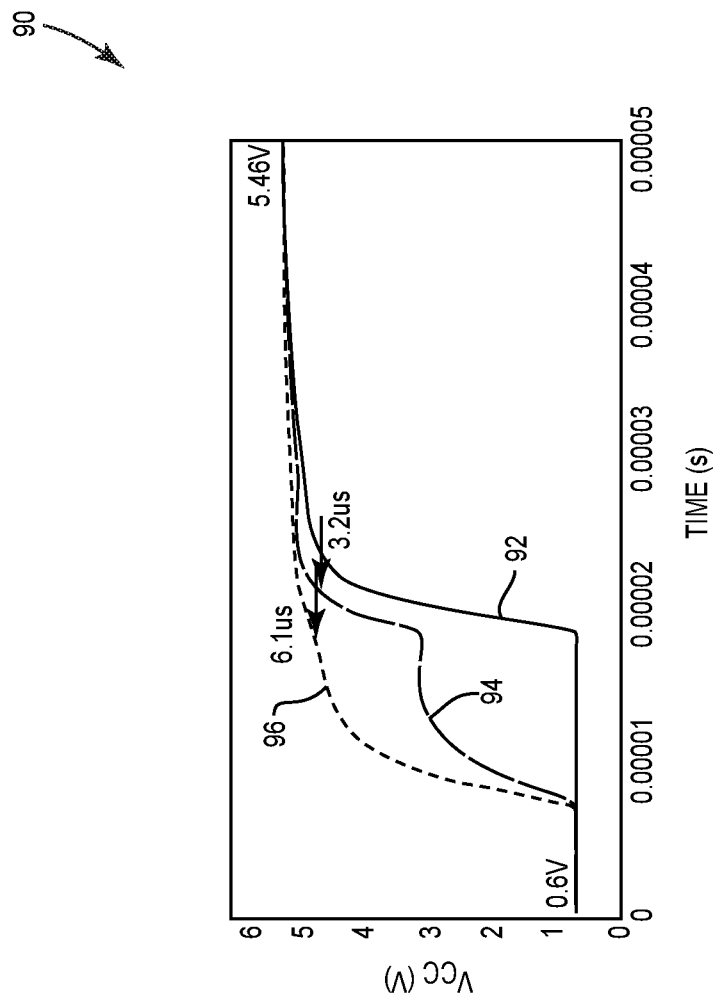

FIG. 4C is a schematic diagram providing an exemplary illustration of an alternative triggering mechanism in the amplifier apparatus of FIG. 3 for causing the APT voltage to increase from the present value to the future value in between a pair of OFDM symbols; and FIG. 5 is a graphic diagram providing exemplary illustration of voltage change time improvement achieved by the multi-level voltage circuit of FIG. 3.

DETAILED DESCRIPTION

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Embodiments of the disclosure relate to a multi-level voltage circuit and related apparatus. The multi-level voltage circuit is configured to provide an average power tracking (APT) voltage to an amplifier circuit for amplifying a radio frequency (RF) signal, which can be modulated in a number of orthogonal frequency division multiplexing (OFDM) symbols. The RF signal may experience power fluctuations from one OFDM symbol to another. Accordingly, the multi-level voltage circuit may need to adjust the APT voltage for each of the OFDM symbols. In examples discussed herein, when the multi-voltage circuit needs to increase the APT voltage from a present value to a higher future value at a predetermined effective time, the multi-level voltage circuit may be configured to start increasing the APT voltage from the present value toward the future value ahead of the predetermined effective time. As such, it may be possible to ramp up the APT voltage in a timely fashion to help improve linearity and efficiency of the amplifier circuit.

Figure 2A:
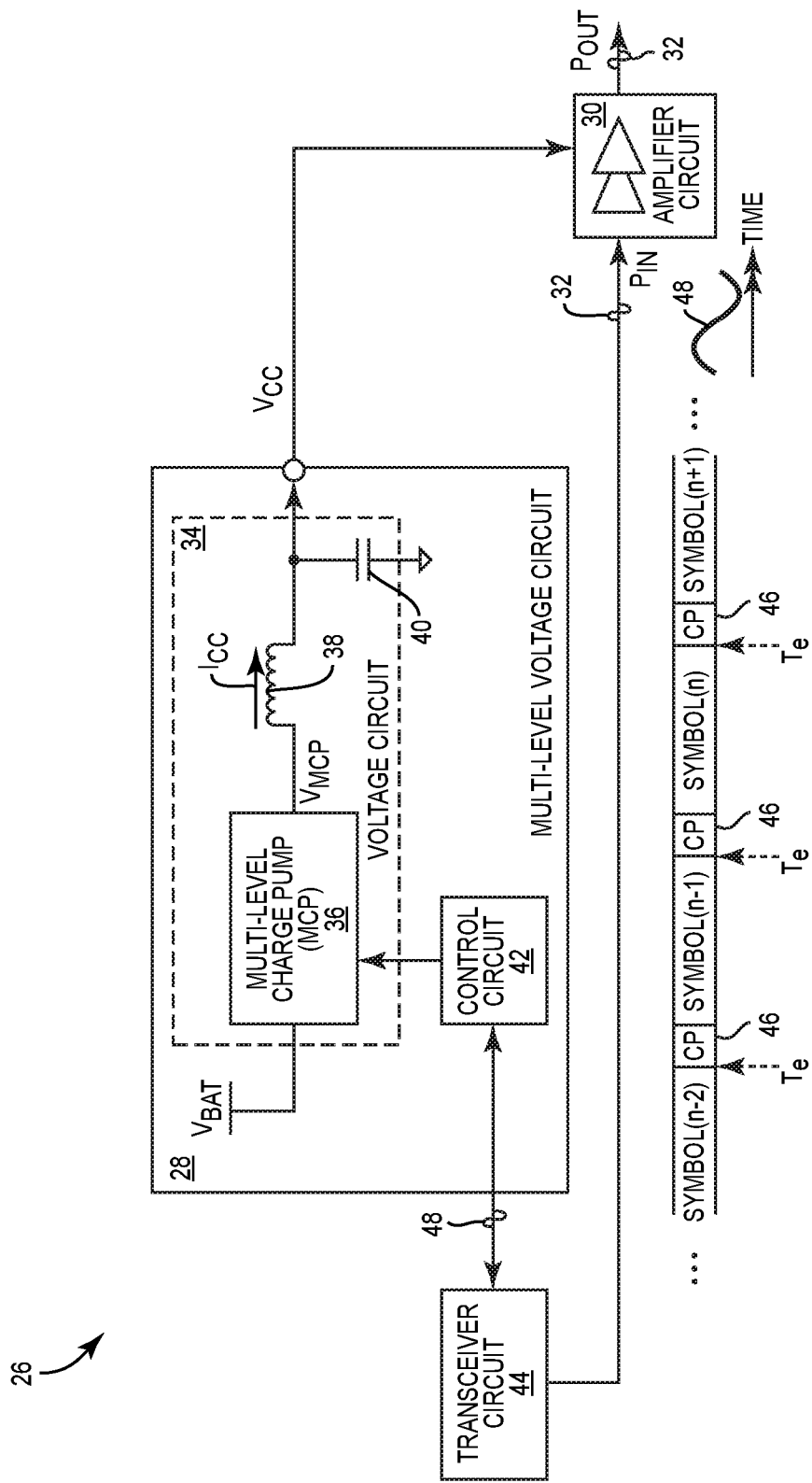
FIG. 2A is a schematic diagram of an exemplary existing amplifier apparatus in which a multi-level voltage circuit is configured to provide an average power tracking (APT) voltage to an amplifier circuit for amplifying an RF signal from an input power to an output power.
Figure 2C:
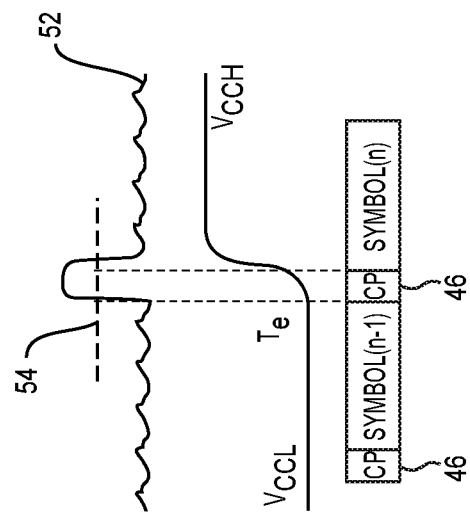
FIG. 2C is a graphic diagram providing an exemplary illustration of degraded error vector magnitude (EVM) as a result of inability of the existing amplifier apparatus of FIG. 2A to ramp up the APT voltage in a timely fashion.
Figure 2B:
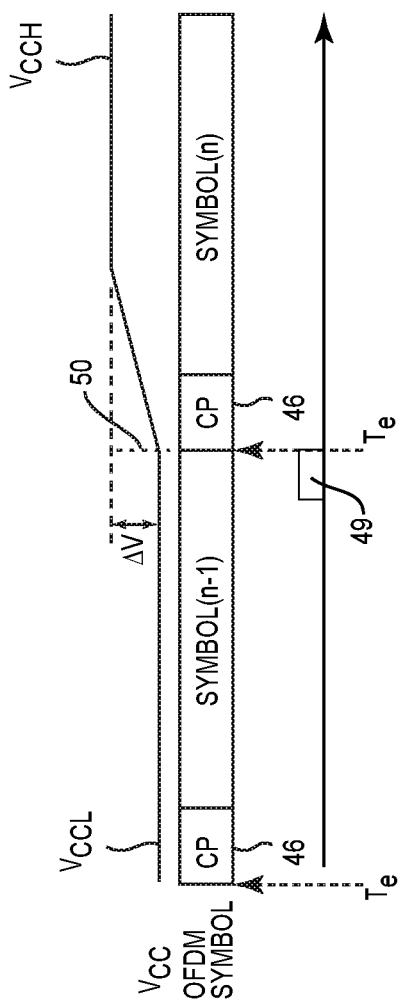
FIG. 2B is a schematic diagram providing an exemplary illustration of a triggering mechanism in the existing amplifier apparatus of FIG. 2A for causing the APT voltage to increase from a present value to a future value in between of a pair of OFDM symbols.

Before discussing a multi-level voltage circuit and related apparatus of the present disclosure, a brief overview of an existing amplifier apparatus is first provided with reference to FIGS. 2A, 2B, and 2C to help understand the need and the difficulty to increase an APT voltage on a per OFDM symbol basis. The discussion of specific exemplary aspects of a multi-level voltage circuit and related apparatus of the present disclosure starts below with reference to FIG. 3.

In this regard, FIG. 2A is a schematic diagram of an exemplary existing amplifier apparatus 26 in which a multi-level voltage circuit 28 is configured to provide an APT voltage $V_{CC}$ to an amplifier circuit 30 for amplifying an RF signal 32 from an input power $P_{IN}$ to an output power $P_{OUT}$. The multi-level voltage circuit 28 includes a voltage circuit 34. The voltage circuit 34 includes a multi-level charge pump (MCP) 36, an inductor 38, and an offset capacitor 40. The MCP 36 is coupled to a battery voltage $V_{BAT}$ and configured to output a constant voltage $V_{MCP}$. The multi-level voltage circuit 28 further includes a control circuit 42. In a non-limiting example, the control circuit 42 can control the MCP 36 to generate the constant voltage $V_{MCP}$ at zero-time of the battery voltage $V_{BAT}$ ($0 \times V_{BAT}$), one-time of the battery voltage $V_{BAT}$ ($1 \times V_{BAT}$), or two-times of the battery voltage $V_{BAT}$ ($2 \times V_{BAT}$).

The constant voltage $V_{MCP}$ may cause the inductor 38 to induce a low-frequency current $I_{CC}$, which in turn charges the offset capacitor 40 to generate the APT voltage $V_{CC}$. The amplifier circuit 30 is configured to receive the APT voltage $V_{CC}$ from the multi-level voltage circuit 28 and amplify the RF signal 32 based on the APT voltage $V_{CC}$.

Figure 1:
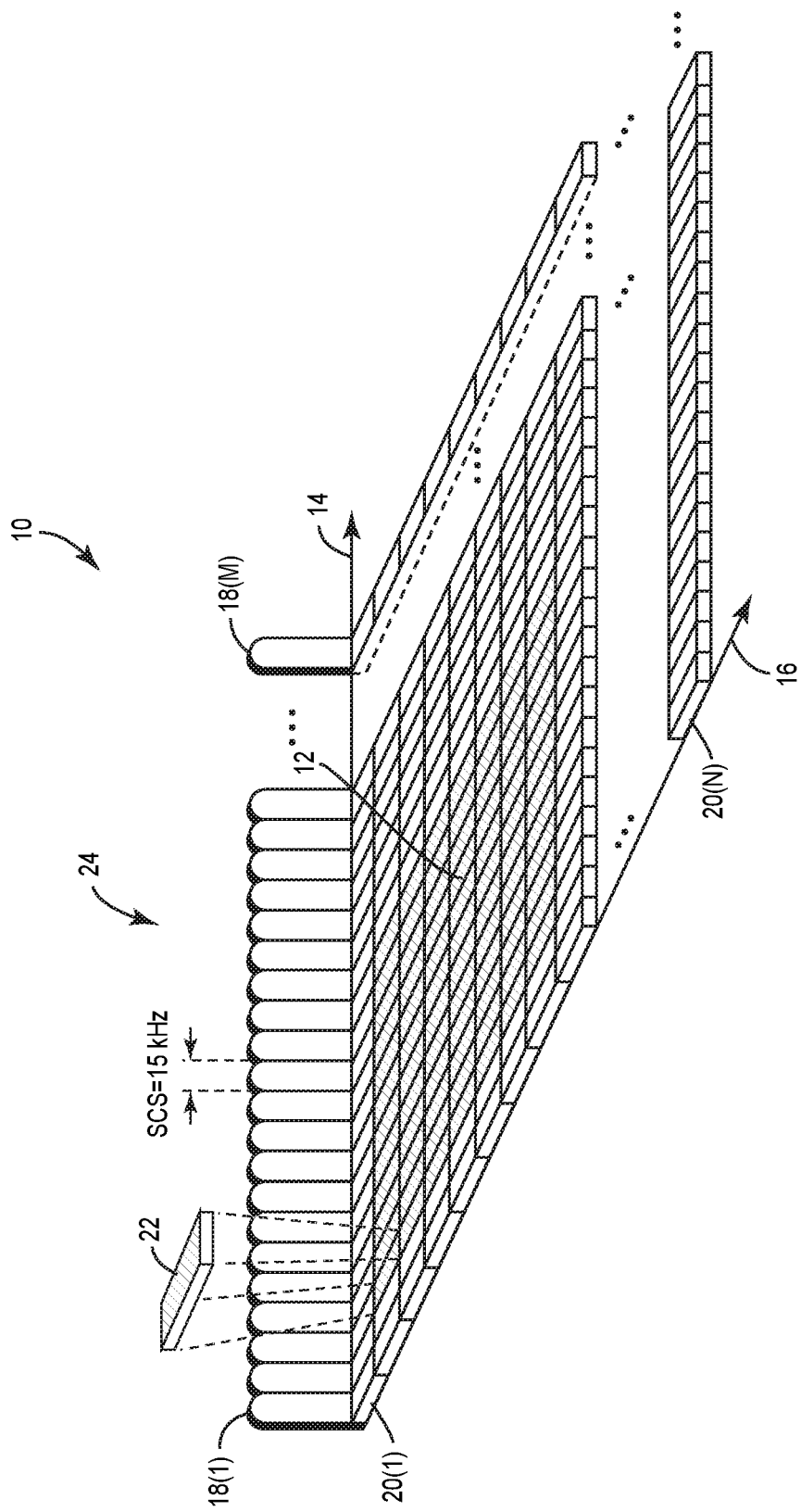
FIG. 1 is a schematic diagram of an exemplary orthogonal frequency division multiplexing (OFDM) time-frequency grid illustrating at least one resource block (RB)

The existing amplifier apparatus 26 may include or be coupled to a transceiver circuit 44 configured to modulate the RF signal 32 into a number of OFDM symbols . . . , SYMBOL(n−2), SYMBOL(n−1), SYMBOL(n), SYMBOL (n+1), . . . that are separated by a respective cyclic prefix (CP) 46. The input power $P_{IN}$ of the RF signal 32 is so modulated to correspond to a time-variant power envelope 48. According to the previous discussion of FIG. 1, the input power $P_{IN}$ can vary (increase or decrease) in each of the OFDM symbols SYMBOL(n−2), SYMBOL(n−1), SYMBOL(n), SYMBOL(n+1), and so on. Accordingly, the voltage circuit 34 may need to adjust the APT voltage $V_{CC}$ in accordance to the time-variant power envelope 48 such that the output power $P_{OUT}$ can be linearly related to the input power $P_{IN}$.

In this regard, the transceiver circuit 44 may be configured to provide a voltage change trigger 49, which indicates a predetermined effective time $T_e$ of the voltage change, to the control circuit 42. In turn, the control circuit 42 controls the voltage circuit 34 to effectuate the voltage change.

FIG. 2B is a schematic diagram providing an exemplary illustration of a triggering mechanism in the existing amplifier apparatus 26 of FIG. 2A for causing the APT voltage $V_{CC}$ to increase from a present value $V_{CCL}$ to a future value $V_{CCH}$ in between of a pair of OFDM symbols SYMBOL (n−1) and SYMBOL(n). Common elements between FIGS. 2A and 2B are shown therein with common element numbers and will not be re-described herein.

As mentioned earlier in FIG. 2A, the control circuit 42 (not shown) is configured to receive the voltage change trigger 49 as the indication of the predetermined effective time $T_e$ of the voltage increase. In a non-limiting example, the voltage change trigger 49 is configured to align with a starting boundary 50 of the SYMBOL(n) to effectuate the voltage change in the SYMBOL(n). In response to receiving the voltage change trigger 49, the control circuit 42 controls the voltage circuit 34 (not shown) to ramp up the APT voltage $V_{CC}$ from the present value $V_{CCL}$ toward the future value $V_{CCH}$. According to previous discussions in FIG. 1, the voltage circuit 34 needs to transition the APT voltage $V_{CC}$ from the present value $V_{CCL}$ to the future value $V_{CCH}$ within the respective CP 46 (e.g., 2.34 µs for 30 KHz SCS).

With reference back to FIG. 2A, the inductor 38 and the offset capacitor 40 in the voltage circuit 34 may function as an inductance-capacitance (LC) circuit, which corresponds to an inherent LC constant determined by respective inductance and capacitance of the inductor 38 and the offset capacitor 40. If the capacitance of the offset capacitor is 40 of 2.2-4.4 microFarad (µF), for example, the voltage circuit 34 may need 3.9 µs to transition from the present value $V_{CCL}$ to the future value $V_{CCH}$. In other words, the voltage circuit 34 will not be able to transition the APT voltage $V_{cc}$ from the present value $V_{CCL}$ to the future value $V_{CCH}$ within the respective CP 46 (e.g., 2.34 us for 30 KHz SCS). Consequently, the amplifier circuit 30 (not shown) may not be able to amplify the RF signal 32 (not shown) to the output power $P_{OUT}$ in proportion to the input power $P_{IN}$. In other words, the time-variant power envelope 48 may be clipped to cause degraded error vector magnitude (EVM) in the amplifier circuit 30.

In this regard, FIG. 2C is a graphic diagram providing an exemplary illustration of degraded EVM as a result of inability of the voltage circuit 34 in the existing amplifier apparatus 26 of FIG. 2A to ramp up the APT voltage $V_{CC}$ in a timely fashion. Common elements between FIGS. 2A-2C are shown therein with common element numbers and will not be re-described herein.

As shown in FIG. 2C, an EVM curve 52 may exceed an EVM limit 54 as a result of the inability of the voltage circuit 34 to ramp up the APT voltage $V_{CC}$ from the present value $V_{CCL}$ to the future value $V_{CCH}$ with the respective CP 46 of the OFDM symbol SYMBOL(n). As such, it may be desired to enhance the multi-level voltage circuit 28 in the existing amplifier apparatus 26 to improve the EVM performance of the amplifier circuit 30.

In this regard, FIG. 3 is a schematic diagram of an amplifier apparatus 56 in which a multi-level voltage circuit 58 is configured according to an embodiment of the present disclosure to increase an APT voltage $V_{CC}$ from a present value $V_{CCL}$ to a future value $V_{CCH}$ in a timely fashion to help improve EVM performance of an amplifier circuit 60. In contrast to the voltage circuit 34 in the existing amplifier apparatus 26, the multi-level voltage circuit 58 in the amplifier apparatus 56 may be controlled to start ramping up the APT voltage $V_{CC}$ independent of the voltage change trigger 49. In a non-limiting example, the multi-level voltage circuit 58 can be configured to start increasing the APT voltage $V_{CC}$ prior to receiving the voltage change trigger 49. As such, the multi-level voltage circuit 58 may have more time to ramp up the APT voltage $V_{CC}$ for the amplifier circuit 60. As a result, it may be possible to avoid potential power envelope clipping, thus helping to improve linearity and efficiency of the amplifier circuit 60.

The multi-level voltage circuit 58 includes a voltage circuit 62. The voltage circuit 62 includes an MCP 64, an inductor 66, and an offset capacitor 68. The MCP 64 is coupled to a battery voltage $V_{BAT}$ and configured to output a constant voltage $V_{MCP}$. The multi-level voltage circuit 58 further includes a control circuit 70. In a non-limiting example, the control circuit 70 can control the MCP 64 to generate the constant voltage $V_{MCP}$ at zero-time of the battery voltage $V_{BAT}$ ($0 \times V_{BAT}$), one-time of the battery voltage $V_{BAT}$ ($1 \times V_{BAT}$), or two-times of the battery voltage $V_{BAT}$ ($2 \times V_{BAT}$).

The constant voltage $V_{MCP}$ may cause the inductor 66 to induce a low-frequency current $I_{CC}$, which in turn charges the offset capacitor 68 to generate the APT voltage $V_{CC}$. The amplifier circuit 60 is configured to receive the APT voltage $V_{CC}$ from the multi-level voltage circuit 58 and amplify an RF signal 72 from a time-variant input power $P_{IN}$ to a time-variant output power $P_{OUT}$ based on the APT voltage $V_{CC}$.

The amplifier apparatus 56 may include or be coupled to a transceiver circuit 74 configured to modulate the RF signal 72 into a number of OFDM symbols . . . , SYMBOL(n−2), SYMBOL(n−1), SYMBOL(n), SYMBOL(n+1), . . . that are separated by a respective cyclic prefix (CP) 76. The time-variant input power $P_{IN}$ of the RF signal 72 is so modulated to correspond to a time-variant power envelope 78. According to the previous discussion of FIG. 1, the time-variant input power $P_{IN}$ can vary (increase or decrease) in each of the OFDM symbols . . . , SYMBOL(n−2), SYMBOL(n−1), SYMBOL(n), SYMBOL(n+1), and so on. Accordingly, the voltage circuit 62 may need to adjust the APT voltage $V_{cc}$ in accordance to the time-variant power envelope 78 such that the time-variant output power $P_{OUT}$ can be linearly related to the time-variant input power $P_{IN}$.

In this regard, the transceiver circuit 74 may be configured to provide a command sequence 80, which can include a voltage indicator configured to indicate the future value $V_{CC2}$ of the APT voltage $V_{CC}$ and a voltage change trigger configured to indicate a predetermined effective time $T_e$ of the voltage increase, to the control circuit 70. In turn, the control circuit 70 controls the voltage circuit 62 to effectuate the voltage increase. The multi-level voltage circuit 58 can be configured to include a number of registers $R_0$-$R_N$ for storing the future value $V_{CC2}$ of the APT voltage $V_{CC}$ and the predetermined effective time $T_e$, among other configuration parameters. In examples discussed herein, $R_0$ represents a lowest numbered register and $R_N$ represents a highest numbered register among the registers $R_0$-$R_N$.

In a non-limiting example, the multi-level voltage circuit 58 can include an RF front-end (RFFE) interface 82 configured to couple the control circuit 70 to the transceiver circuit 74. In this regard, the transceiver circuit 74 can be configured to provide an RFFE command sequence 84 (e.g., an RFFE extended register write command sequence) as the command sequence 80. The RFFE command sequence 84 may be configured to write to the registers $R_0$-$R_N$ sequentially from the lowest numbered register $R_0$ to the highest numbered register $R_N$. In a non-limiting example, the voltage indicator indicating the future value $V_{CC2}$ of the APT voltage $V_{CC}$ is configured to be stored in a lower numbered register (e.g., $R_3$) and the voltage change trigger indicating the predetermined effective time $T_e$ is configured to be stored in a higher numbered register (e.g., $R_{28}$). In this regard, the control circuit 70 will receive the future value $V_{CC2}$ prior to receiving the predetermined effective time $T_e$. Accordingly, the multi-level voltage circuit 58 can be configured to increase the APT voltage $V_{CC}$ from the present value $V_{CCL}$ toward the future value $V_{CCH}$ after receiving the future value $V_{CC2}$ and prior to receiving the predetermined effective time $T_e$. Therefore, the multi-level voltage circuit 58 can be said to increase the APT voltage $V_{CC}$ from the present value $V_{CCL}$ toward the future value $V_{CCH}$ independent of the predetermined effective time $T_e$.

FIG. 4A is a schematic diagram providing an exemplary illustration of a triggering mechanism in the amplifier apparatus 56 of FIG. 3 for causing the APT voltage $V_{CC}$ to increase from the present value $V_{ca}$ to the future value $V_{CCH}$ in between a pair of OFDM symbols SYMBOL(n−1) and SYMBOL(n). Common elements between FIGS. 3 and 4A are shown therein with common element numbers and will not be re-described herein.

Notably, the OFDM symbol SYMBOL(n−1) can be any selected OFDM symbol among the OFDM symbols . . . , SYMBOL(n−2), SYMBOL(n−1), SYMBOL(n), SYMBOL(n+1), and so on. Likewise, OFDM symbol SYMBOL(n) can be any second selected OFDM symbol immediately succeeding the selected OFDM SYMBOL(n−1) among the OFDM symbols . . . , SYMBOL(n−2), SYMBOL(n−1), SYMBOL(n), SYMBOL(n+1), and so on. It should be appreciated that the multi-level voltage circuit 58 can be configured to support voltage changes between any pair of the OFDM symbols . . . , SYMBOL(n−2), SYMBOL(n−1), SYMBOL(n), SYMBOL (n+1), and so on.

In a non-limiting example, the control circuit 70 can be configured to control the voltage circuit 62 to increase the APT voltage $V_{CC}$ from the present value $V_{CCL}$ to at least one intermediate value $V_{CCM}$ in between the present value $V_{CCL}$ and the future value $V_{CCH}$ before the predetermined effective time $T_e$. In this regard, the voltage circuit 62 may start ramping up the APT voltage immediately upon the future value $V_{CCH}$ being written into the register $R_3$ and prior to the predetermined effective time $T_e$ being written into the register $R_{28}$. Subsequently at the predetermined effective time $T_e$, the voltage circuit 62 may continue increasing the APT voltage $V_{CC}$ from the intermediate value $V_{CCM}$ to the future value $V_{CCH}$. The intermediate value $V_{CCM}$ may be lower than one-half (½) of the future value $V_{CCH}$, equal to one-half (½) of the future value $V_{CCH}$, or higher than one-half (½) of the future value $V_{CCH}$. It should be appreciated that it may also be possible to control the voltage circuit 62 to increase the APT voltage $V_{CC}$ from the present value $V_{CCL}$ to the future value $V_{CCH}$ via multiple intermediate values $V_{CCM}$.

In this regard, at the predetermined effective time $T_e$, the voltage circuit 62 only needs to increase the APT voltage $V_{CC}$ from the intermediate value $V_{CCM}$ to the future value $V_{CCH}$, as opposed to having to increase the APT voltage $V_{CC}$ from the present value $V_{CCL}$ to the future value $V_{CCH}$. As such, it may be possible to ramp up the APT voltage $V_{CC}$ from the present value $V_{CCL}$ to the future value $V_{CCH}$ within the respective CP 76 of the OFDM symbol SYMBOL(n). As a result, it may be possible to improve EVM performance of the amplifier circuit 60.

FIG. 4B is a graphic diagram providing an exemplary illustration of improved EVM as a result of the ability of the voltage circuit 62 in the amplifier apparatus 56 of FIG. 3 to ramp up the APT voltage $V_{CC}$ in a timely fashion. Common elements between FIGS. 3, 4A, and 4B are shown therein with common element numbers and will not be re-described herein.

As shown in FIG. 4B, although an EVM curve 86 may increase in the OFDM symbol SYMBOL(n−1) as a result of ramping the APT voltage $V_{CC}$ from the present value $V_{CCL}$ to the intermediate value $V_{CCM}$, the EVM curve 86 remains below an EVM limit 88. As such, it may be possible to improve the EVM performance of the amplifier circuit 60.

FIG. 4C is a schematic diagram providing an exemplary illustration of an alternative triggering mechanism in the amplifier apparatus 56 of FIG. 3 for causing the APT voltage $V_{CC}$ to increase from the present value $V_{CCL}$ to the future value $V_{CCH}$ in between a pair of OFDM symbols SYMBOL (n−1) and SYMBOL(n). Common elements between FIGS. 3 and 4C are shown therein with common element numbers and will not be re-described herein.

In a non-limiting example, the control circuit 70 can be configured to control the voltage circuit 62 to increase the APT voltage $V_{CC}$ from the present value $V_{CCL}$ to the future value $V_{CCH}$ before the predetermined effective time $T_e$. In this regard, the voltage circuit 62 may start ramping up the APT voltage immediately upon the future value $V_{CCH}$ being written into the register $R_3$ and prior to the predetermined effective time $T_e$ being written into the register $R_{28}$.

FIG. 5 is a graphic diagram 90 providing exemplary illustration of voltage change time improvement achieved by the multi-level voltage circuit 58 of FIG. 3. The graphic diagram 90 includes a first voltage change timing curve 92, a second voltage change timing curve 94, and a third voltage change timing curve 96. The first voltage change timing curve 92 corresponds to the triggering mechanism as previously described in FIG. 2B, the second voltage change timing curve 94 corresponds to the triggering mechanism as previously described in FIG. 4A, and the third voltage change timing curve 96 corresponds to the alternative triggering mechanism as previously described in FIG. 4C. In a non-limiting example, the multi-level voltage circuit 58 in FIG. 3 can increase the APT voltage $V_{CC}$ from the present value $V_{CCL}$ to the future value $V_{CCH}$ with approximately 3.2 μs improvement over the multi-level voltage circuit 28 in FIG. 2A when the multi-level voltage circuit 58 operates based on the triggering mechanism as described in FIG. 4A. In another non-limiting example, the multi-level voltage circuit 58 in FIG. 3 can increase the APT voltage $V_{CC}$ from the present value $V_{CCL}$ to the future value $V_{CCH}$ with approximately 6.2 μs improvement over the multi-level voltage circuit 28 in FIG. 2A when the multi-level voltage circuit 58 operates based on the alternative triggering mechanism as described in FIG. 4C.

Those skilled in the art will recognize improvements and modifications to the preferred embodiments of the present disclosure. All such improvements and modifications are considered within the scope of the concepts disclosed herein and the claims that follow.

What is claimed is:

1. A multi-level voltage circuit comprising:
    a voltage circuit coupled to an amplifier circuit and configured to provide an average power tracking (APT) voltage to the amplifier circuit for amplifying a radio frequency (RF) signal; and
    a control circuit coupled to the voltage circuit and configured to:
        receive a command sequence comprising:
            a voltage indicator configured to indicate a future value of the APT voltage higher than a present value of the APT voltage; and
            a voltage change trigger succeeding the voltage indicator in the command sequence and configured to indicate a predetermined effective time of the future value; and
        control the voltage circuit to start increasing the APT voltage from the present value toward the future value prior to receiving the voltage change trigger.

2. The multi-level voltage circuit of claim 1 wherein the control circuit is further configured to:
    control the voltage circuit to increase the APT voltage from the present value to at least one intermediate value higher than the present value of the APT voltage and lower than the future value of the APT voltage before the predetermined effective time; and
    control the voltage circuit to increase the APT voltage from the at least one intermediate value to the future value at the predetermined effective time.

3. The multi-level voltage circuit of claim 2 wherein the at least one intermediate value is configured to equal one-half of the future value of the APT voltage.

4. The multi-level voltage circuit of claim 1 wherein the control circuit is further configured to control the voltage circuit to increase the APT voltage from the present value to the future value before the predetermined effective time of the future value.

5. The multi-level voltage circuit of claim 1 wherein:
    the RF signal is modulated in a plurality of orthogonal frequency division multiplex (OFDM) symbols; and
    the control circuit is further configured to:
        receive the command sequence in a selected OFDM symbol among the plurality of OFDM symbols; and
        control the voltage circuit to effectuate the future value of the APT voltage in a second selected OFDM symbol immediately succeeding the selected OFDM symbol among the plurality of OFDM symbols.

6. The multi-level voltage circuit of claim 5 wherein the predetermined effective time of the future value of the APT voltage is configured to align with a starting boundary of the second selected OFDM symbol.

7. The multi-level voltage circuit of claim 1 further comprising a plurality of registers, wherein:
    a lower numbered register among the plurality of registers is configured to store the voltage indicator; and
    a higher numbered register among the plurality of registers is configured to store the voltage change trigger.

8. The multi-level voltage circuit of claim 7 wherein the command sequence comprises an RF front-end (RFFE) extended register write command sequence configured to write sequentially from the lower numbered register to the higher numbered register.

9. The multi-level voltage circuit of claim 8 wherein the control circuit is further configured to control the voltage circuit to increase the APT voltage from the present value toward the future value when the RFFE extended register write command sequence completes writing the lower numbered register and prior to the RFFE extended register write command sequence completing writing the higher numbered register.

10. An amplifier apparatus comprising:
- an amplifier circuit configured to amplify a radio frequency (RF) signal based on an average power tracking (APT) voltage; and
- a multi-level voltage circuit comprising:
  - a voltage circuit configured to provide the APT voltage to the amplifier circuit; and
  - a control circuit coupled to the voltage circuit and configured to:
    - receive a command sequence comprising:
      - a voltage indicator configured to indicate a future value of the APT voltage higher than a present value of the APT voltage; and
      - a voltage change trigger succeeding the voltage indicator in the command sequence and configured to indicate a predetermined effective time of the future value; and
    - control the voltage circuit to start increasing the APT voltage from the present value toward the future value prior to receiving the voltage change trigger.

11. The amplifier apparatus of claim 10 further comprising a transceiver circuit configured to provide the RF signal and the command sequence to the amplifier circuit and the control circuit, respectively.

12. The amplifier apparatus of claim 11 wherein the transceiver circuit is coupled to the control circuit via an RF front-end (RFFE) interface.

13. The amplifier apparatus of claim 10 wherein the control circuit is further configured to:
- control the voltage circuit to increase the APT voltage from the present value to at least one intermediate value higher than the present value of the APT voltage and lower than the future value of the APT voltage before the predetermined effective time; and
- control the voltage circuit to increase the APT voltage from the at least one intermediate value to the future value at the predetermined effective time.

14. The amplifier apparatus of claim 13 wherein the at least one intermediate value is configured to equal one-half of the future value of the APT voltage.

15. The amplifier apparatus of claim 10 wherein the control circuit is further configured to control the voltage circuit to increase the APT voltage from the present value to the future value before the predetermined effective time of the future value.

16. The amplifier apparatus of claim 10 wherein:
- the RF signal is modulated in a plurality of orthogonal frequency division multiplex (OFDM) symbols; and
- the control circuit is further configured to:
  - receive the command sequence in a selected OFDM symbol among the plurality of OFDM symbols; and
  - control the voltage circuit to effectuate the future value of the APT voltage in a second selected OFDM symbol immediately succeeding the selected OFDM symbol among the plurality of OFDM symbols.

17. The amplifier apparatus of claim 16 wherein the predetermined effective time of the future value of the APT voltage is configured to align with a starting boundary of the second selected OFDM symbol.

18. The amplifier apparatus of claim 10 wherein the multi-level voltage circuit further comprises a plurality of registers, wherein:
- a lower numbered register among the plurality of registers is configured to store the voltage indicator; and
- a higher numbered register among the plurality of registers is configured to store the voltage change trigger.

19. The amplifier apparatus of claim 18 wherein the command sequence comprises an RF front-end (RFFE) extended register write command sequence configured to write sequentially from the lower numbered register to the higher numbered register.

20. The amplifier apparatus of claim 19 wherein the control circuit is further configured to control the voltage circuit to increase the APT voltage from the present value toward the future value when the RFFE extended register write command sequence completes writing the lower numbered register and prior to the RFFE extended register write command sequence completing writing the higher numbered register.

* * * * *